(12) United States Patent
Awano et al.

(10) Patent No.: US 7,696,512 B2
(45) Date of Patent: Apr. 13, 2010

(54) ELECTRON DEVICE AND PROCESS OF MANUFACTURING THEREOF

(75) Inventors: Yuji Awano, Kawasaki (JP); Kazuhiko Matsumoto, Ibaraki (JP)

(73) Assignees: Fujitsu Limited, Kawasaki (JP); National Institute of Advanced Industrial Science and Technology, Tokyo (JP)

( * ) Notice: Subject to any disclaimer, the term of this patent is extended or adjusted under 35 U.S.C. 154(b) by 23 days.

(21) Appl. No.: 10/440,332

(22) Filed: May 19, 2003

(65) Prior Publication Data
US 2003/0214054 A1 Nov. 20, 2003

(30) Foreign Application Priority Data
May 20, 2002 (JP) ............................ 2002-144905

(51) Int. Cl.
*H01L 29/12* (2006.01)
(52) U.S. Cl. .................. 257/24; 257/E51.04; 977/745; 977/748; 977/749
(58) Field of Classification Search .................. 257/24
See application file for complete search history.

(56) References Cited

U.S. PATENT DOCUMENTS

| | | | |
|---|---|---|---|
| 6,423,583 B1 | 7/2002 | Avouris et al. | |
| 6,472,705 B1* | 10/2002 | Bethune et al. | 257/314 |
| 6,515,339 B2* | 2/2003 | Shin et al. | 257/368 |
| 2001/0006869 A1 | 7/2001 | Okamoto et al. | |
| 2002/0014667 A1 | 2/2002 | Shin et al. | |
| 2002/0173083 A1 | 11/2002 | Avouris et al. | |
| 2004/0031975 A1* | 2/2004 | Kern et al. | 257/213 |
| 2004/0164327 A1 | 8/2004 | Shin et al. | |

(Continued)

FOREIGN PATENT DOCUMENTS

JP 07-029462 A 1/1995

(Continued)

OTHER PUBLICATIONS

Cui et al, "Room Temperature . . . Nanotubes", Nano Letters 2002 vol. 2 No. 2 pp. 117-120. published on the web Dec. 20, 2001.*

(Continued)

*Primary Examiner*—Jerome Jackson, Jr.
(74) *Attorney, Agent, or Firm*—Westerman, Hattori, Daniels & Adrian, LLP (57) ABSTRACT

The electron device of the present invention has a carbon-based linear structural body including at least one conductive particle, a first electrode and a second electrode disposed at both end of the carbon-based linear structural body, so as to subject the carbon-based linear structural body including at least one conductive particle to connect between the first electrode and the second electrode. A process of manufacturing the electron device includes steps of: forming a carbon-based linear structural body including at least one conductive particle, using a catalyst of a first island and a second island selected from two or more of islands of the catalyst on a substrate; and forming a first electrode and a second electrode so as to connect the first electrode with the first island and one end of the carbon-based linear structural body, and the second electrode with the second island and the other end of the carbon-based linear structural body.

7 Claims, 8 Drawing Sheets

U.S. PATENT DOCUMENTS

2004/0238887 A1* 12/2004 Nihey .................... 257/347
2004/0247241 A1* 12/2004 Briggs .................... 385/31

FOREIGN PATENT DOCUMENTS

| JP | 10-203810 A | 8/1998 |
| JP | 2001-180920 A | 7/2001 |
| JP | 2001-261316 A | 9/2001 |
| JP | 2002-11824 | 1/2002 |
| JP | 2002-097010 A | 4/2002 |
| JP | 2002-118248 A | 4/2002 |
| JP | 2003-17508 A | 1/2003 |
| JP | 2004-517489 A | 6/2004 |

OTHER PUBLICATIONS

Bockrath et al. Science vol. 291, Jan. 12, 2001, pp. 283-285 "Resonant . . . Nanotubes".*

Richard Martel et al., Carbon Nanotube Field Effect Transistors for Logic Applications; Technical Digest; International Electron Devices Meeting, Washington, D.C. Dec. 2-5, 2001; IBM T.J. Watson Research Center; Yorktown Heights, New York, U.S.A.

Kazuhiko Matsumoto et al.; "Room temperature operation of a single electron transistor made by the scanning tunneling microscope nanooxidation process for the $TiO_x/Ti$ system"; Applied Physics letter vol. 68, No. 1, Jan. 1, 1996; pp. 34-36.

Kazuhiko Matsumoto et al.; "Room-temperature single-electron memory made by pulse-mode atomic force microscopy nano oxidation process on atomically flat α-alumina substrate"; Applied Physics letters vol. 68, No. 1, Jan. 1, 1996; pp. 239-241.

K. Matsumoto et al.; "Room temperature operation of a single electron transistor made by the scanning tunneling microscope nanooxidation process for the $TiO_x/Ti$ system"; Applied Physics letter vol. 68, No. 1, Jan. 1, 1996; pp. 34-36.

Kazuhiko Matsumoto et al.; "Room-temperature single-electron memory made by pulse-mode atomic force microscopy nano oxidation process on atomically flat α-alumina substrate"; Applied Physics letter vol. 76, No. 2, Jan. 10, 2000; pp. 239-241.

Japanese Office Action dated Mar. 31, 2009 issued in corresponding Application No. 2002-144905.

Japanese Office Action dated Dec. 22, 2009, issued in corresponding Japanese Patent Application No. 2002-144905.

* cited by examiner

FIG.8A $$4H_2O + 4e^- \rightarrow 4OH^- + 2H_2$$
$$Ti + 4h^+ + 2OH^- \rightarrow TiO_2 + 2H^+$$

Prior Art

FIG.8B

Prior Art

ELECTRON DEVICE AND PROCESS OF MANUFACTURING THEREOF

CROSS-REFERENCE TO RELATED APPLICATIONS

This application is based upon and claims the benefits of the priority from the prior Japanese Patent Application No. 2002-144905, filed in May 20, 2002, the entire contents of which are incorporated herein by reference.

BACKGROUND OF THE INVENTION

1. Field of the Invention

The present invention relates to an electron device, which is suitable for single electron transistors utilizing carbon nanotubes which are self-organizing nanostructures, and to an efficient process of manufacturing the electron device.

2. Description of the Related Art

Figure 8A:
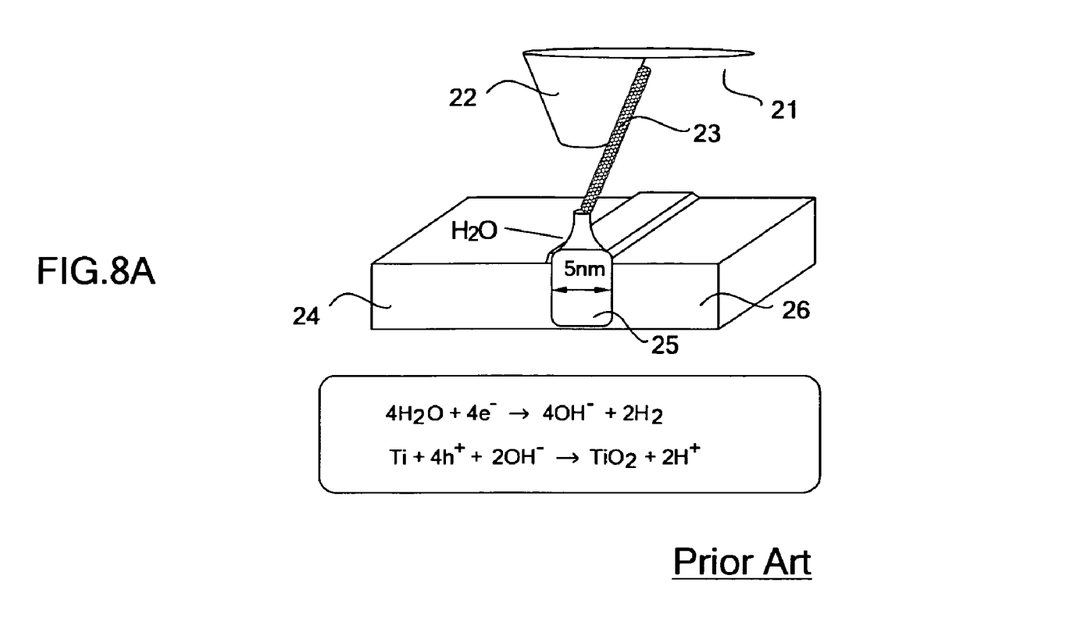
FIG. 8A is a schematic diagram for explaining AFM anodization using a carbon nanotube AFNM cantilever.
Figure 8B:
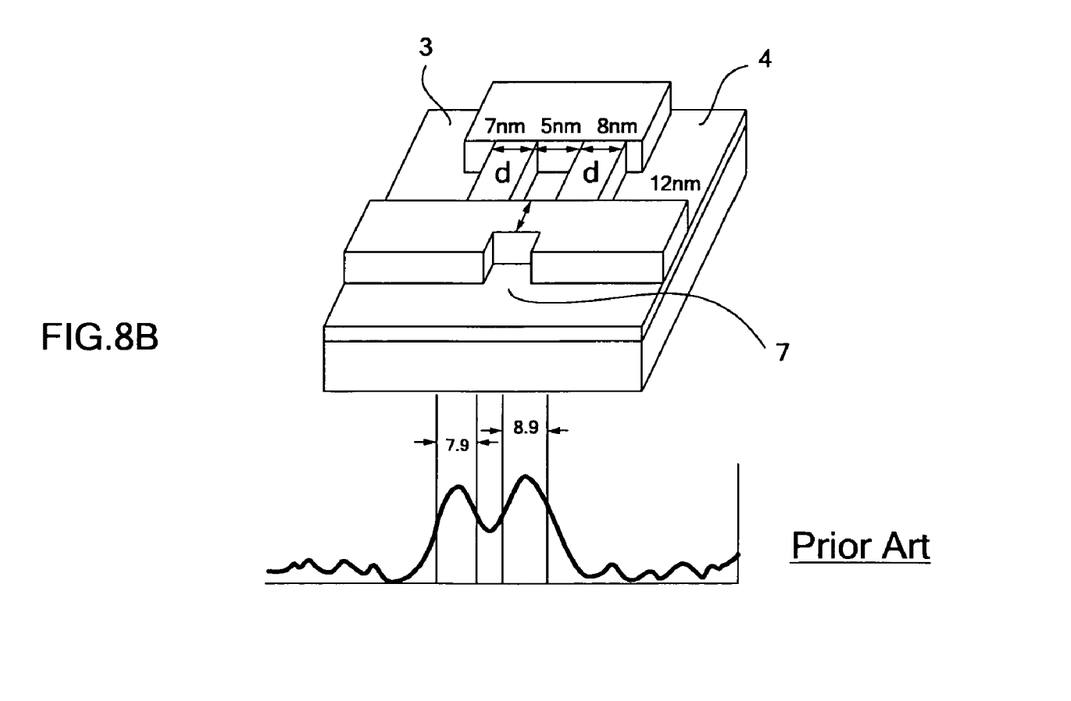
FIG. 8B is a schematic diagram for explaining manufacture of a conventional single electron transistor by AFM anodization.

A single electron transistor is a three-terminal element utilizing the single electron effect. The single electron effect is also called the Coulomb blockade effect, and this effect is based on a phenomenon derived from the fact that there exists no smaller quantity of electricity than the unit electric charge amount of an electron. When a capacitor is made to approach the nanometer level in size, the electrons stored in the capacitor can move between the electrodes due to the tunnel effect. However, when the capacity of the capacitor electrodes is extremely small (e.g., about $10^{-18}$ farads), the change in the static electric potential, which arises due to one electron tunneling, greatly changes the voltage applied to the capacitor (the tunnel junction). If this change reverses the orientation of the voltage applied to the tunnel junction, the tunnel phenomenon will actually not arise. By using this phenomenon that the tunnel phenomenon does not arise in a finite voltage range, it is possible to make electrons discretely tunnel one-by-one. This is called the single electron effect. A conventional process of manufacturing and a structure of a single electron transistor which utilizes this effect is shown in FIGS. 8A and 8B. In this single electron transistor, a Ti thin film is oxidized locally by AFM anodization using a carbon nanotube AFM cantilever "21" in which a carbon nanotube having a diameter of 1 to 2 nm "23" formed on a silicon tip "22", and Ti metal islands "24", "26", and a Ti oxide film capacitor "25" are formed. In this manufacturing process, because AFM (Atomic Force Microscope) is used, operation at the atom level is possible and the single electron transistor having a size of nano meter level can be obtained, as shown in FIG. 8B. However, because the anodizing phenomenon is utilized for forming the Ti metal islands, there are limits in size reductions thereof. It has therefore been desired to provide a single electron transistor, which can easily be manufactured and can be made even finer, and to provide an efficient process of manufacturing such a single electron transistor.

SUMMARY OF THE INVENTION

An object of the present invention is to provide an electron device which has a fine structure, which operates extremely stably at room temperature, which can be mass produced inexpensively by utilizing photolithography, CVD, or the like, and which is particularly suitable for single electron transistors. A further object of the present invention is to provide an efficient process of fabricating the electron device.

The following has conventionally been known regarding carbon nanotubes. A carbon nanotube is a self-organizing structure in which a graphite sheet (graphene) formed of carbon atoms is rolled into a cylinder shape having a diameter of about 0.4 nm to 10 nm. Carbon nanotubes have such a conductive characteristic that they can become metallic and they can become semiconductive, depending on the difference in the chirality thereof (the way the graphite sheet is rolled up in a cylinder shape). Carbon nanotubes are generally formed by arc discharging, laser ablation, and the like. Recently, it has been announced that carbon nanotubes can also be formed by CVD growth from a patterned catalyst metal, in consideration of applications to devices. Further, it is known that, when an external electric field is applied during the CVD growth, the direction of growth of the carbon nanotube is the direction of the electric field. The present invention efficiently provides a single electron transistor which has a fine structure, by utilizing carbon-based linear structural bodies such as the above mentioned carbon nanotubes which have a self-organizing structure and various characteristics.

One embodiment of an electron device of the present invention comprises, a carbon-based linear structural body which includes at least one conductive particle, a first electrode which is disposed at one end of the carbon-based linear structural body, and a second electrode which is disposed at the other end of the carbon-based linear structural body, so as to subject the carbon-based linear structural body including at least one conductive particle to connect between the first electrode and the second electrode. In this electron device, at least one conductive particle, which functions as an island, is included within the carbon-based linear structural body. The conductive particle is electrically isolated within the carbon-based linear structural body, and a plurality of tunnel junctions are connected in series in the carbon-based linear structural body. Thus, when the first electrode is made to function as a source electrode and the second electrode is made to function as a drain electrode, the electron device functions as a single electron device. Further, when a third electrode, which imparts an electric field effect to the carbon-based linear structural body, is formed in a state of being electrically insulated from the first electrode and the second electrode, the electron device functions as a single electron transistor.

Another embodiment of an electron device of the present invention comprises, a carbon-based linear structural body including at least two lattice defects; a first electrode disposed at one end of the carbon-based linear structural body; and a second electrode at the other end of the carbon-based linear structural body, so as to subject the carbon-based linear structural body including at least two lattice defects to connect between the first electrode and the second electrode. In this electron device, at least two lattice defects are included within the carbon-based linear structural body. An island-shaped carbon-based linear structure portion, which is in between the lattice defects, is electrically isolated from others. The island-shaped carbon-based linear structure portion, which is in between the lattice defects, exists within the carbon-based linear structural body, and a plurality of tunnel junctions are connected in series. Thus, when the first electrode is made to function as a source electrode and the second electrode is made to function as a drain electrode, the electron device functions as a single electron device. Further, when a third electrode, which imparts an electric field effect to the carbon-based linear structural body, is formed in a state of being electrically insulated from the first electrode and the second electrode, the electron device functions as a single electron transistor.

A process of manufacturing an electron device of the present invention comprises the steps as follow. The first step is to form a carbon-based linear structural body including at least one conductive particle, using a catalyst of a first island and a second island selected from two or more of islands formed of the catalyst on a substrate, so that the carbon-based linear structural body including at least one conductive particle connects between the first island and the second island. The second step is to form a first electrode and a second electrode so that the first electrode contacts with the first island and one end of the carbon-based linear structural body, and the second electrode contacts with the second island and the other end of the carbon-based linear structural body. As a result, the first electrode and the second electrode are connected through the carbon-based linear structural body including at least one conductive particle, and at least one conductive particle is positioned between the first electrode and the second electrode. In this process of manufacturing an electron device, the carbon-based linear structural body (such as a carbon nanotube or the like) including particles formed of the catalyst, is formed by chemical vapor deposition (CVD) or the like so as to connect the first island and the second island selected from two or more islands formed of the catalyst on a substrate. Next, a first electrode is formed so as to contact the first island and the carbon-based linear structural body, and a second electrode is formed so as to contact the second island and the carbon-based linear structural body. As a result, a single electron device is obtained.

Another process of manufacturing an electron device of the present invention comprises the steps as follow. The first step is form a carbon-based linear structural body including at least two lattice defects, using a catalyst of a first island and a second island selected from two or more of islands formed of the catalyst on a substrate, so that the carbon-based linear structural body connects between the first island and the second island. The second step is to form a first electrode and a second electrode so that the first electrode contacts with the first island and one end of the carbon-based linear structural body, and the second electrode contacts with the second island and the other end of the carbon-based linear structural body. As a result, the first electrode and the second electrode are connected though the carbon-based linear structural body including at least two lattice defects, and the at least two lattice defects are positioned between the first electrode and the second electrode. In this process of manufacturing an electron device, the carbon-based linear structural body (such as a carbon nanotube or the like) including at least two lattice defects, is formed by CVD or the like so as to connect the first island and the second island among two or more islands formed of a catalyst on a substrate. Next, the first electrode is formed so as to contact with the first island and the carbon-based linear structural body, and the second electrode is formed so as to contact with the second island and the carbon-based linear structural body. As a result, a single electron device is obtained.

DESCRIPTION OF THE PREFERRED EMBODIMENTS

The electron device of the present invention has a carbon-based linear structural body including at least one conductive particle; and a first electrode and a second electrode which are disposed such that at least one conductive particle included in the carbon-based linear structural body is disposed between the first electrode and the second electrode. As needed, the electron device may also have a third electrode which imparts an electric field effect to the carbon-based linear structural body, and other members. The term "electron device" of the present invention refers to devices such as electron devices, semiconductor devices, single electron semiconductor devices and the like.

The carbon-based linear structural body is not particularly limited as long as it has a structure in which a plurality of tunnel junctions are connected in series at the interior thereof, and can be appropriately selected in accordance with the object. Suitable examples include a carbon-based linear structural body containing at least one conductive particle, a carbon-based linear structural body containing at least two lattice defects, and the like.

The conductive particle is not particularly limited as long as it is conductive and can function as an island, and the conductive particles can be appropriately selected in accordance with the object. Suitable examples include metal particles, fullerene, metal-encased fullerene, and the like. Among these, metal particles are preferable.

Suitable examples of the metal particles are transition metals, alloys of transition metals, and the like. It is preferable to select at least one type from thereamong.

Suitable examples of the transition metals are iron, nickel, cobalt and the like, and the transition metal is selected from thereamong.

The lattice defect is not particularly limited as long as the region of the carbon-based linear structural body, which is surrounding the lattice defects, functions as an island, and the lattice defect can be appropriately selected in accordance with the object. Examples include vacancy of a carbon atom, deformation of a carbon atom, substitution of a carbon atom with another impurity atom, and the like, and the lattice defect is preferably selected from thereamong.

In the present invention, the number of conductive particles which function as islands in the carbon-based linear structural body, or the number of regions in the carbon-based linear structural body which are surrounding lattice defects and function as islands, is one or more, and is not particularly limited, and can be appropriately selected in accordance with the object.

When the carbon-based linear structural body is a carbon-based linear structural body containing at least one conductive particle, a portion of the carbon-based linear structural body functions as a tunnel junction. When the carbon-based linear structural body is a carbon-based linear structural body containing at least two lattice defects, the carbon-based linear structural body functions as a conductive material.

The carbon-based linear structural body is not particularly limited, and can be appropriately selected in accordance with the object. However, a structural body in which six-membered carbon rings or five-membered carbon rings are connected each other is preferable, and carbon nanotubes are particularly preferable. The carbon nanotube may have a single wall structure or a multiwall structure.

The number of carbon-based linear structural bodies is not particularly limited, and can be appropriately selected in accordance with the object, and may be one or may be two or more.

In the present invention, the electron device preferably includes a third electrode, which imparts an electric field effect to the carbon-based linear structural body. In this case, each of the first electrode and the second electrode functions as each of a source electrode and a drain electrode, the third electrode functions as a gate electrode, and the such electron device functions as a single electron transistor. When the third electrode is made to function as a gate electrode, the behavior of the single electron transistor can be controlled by appropriately controlling the gate voltage of the third electrode.

The first electrode, the second electrode and the third electrode are not particularly limited, and can be appropriately selected from among known electrodes used in electron devices. Suitable examples are metal electrodes and the like.

The electron device of the present invention can be suitably used in various fields as a single electron device, a single electron transistor, a semiconductor device, a single electron semiconductor device, or the like. The electron device of the present invention is preferably manufactured in accordance with the process of manufacturing an electron device of the present invention, which will be described hereinafter.

The process of manufacturing an electron device of the present invention includes the steps of forming a carbon-based linear structural body so as to connect a first island and a second island selected from two or more islands formed of a catalyst on a substrate (this step may be referred as a "carbon-based linear structural body forming step" hereinafter), and forming a first electrode so as to contact with the first island and one end of the carbon-based linear structural body, and a second electrode so as to contact with the second island and the other end of the carbon-based linear structural body (this step may be referred as an "electrode forming step" hereinafter). As needed, the process may also include a step of, after forming the first electrode and the second electrode, forming a third electrode, which imparts an electric field effect to the carbon-based linear structural body, in a state that the third electrode is electrically insulated from the first electrode and the second electrode (this step may be referred as a "third electrode forming step" hereinafter). Or, the process may include, as needed, other steps which are appropriately selected.

In the carbon-based linear structural body forming step, a carbon-based linear structural body is formed so as to connect a first island and a second island selected from two or more islands formed of a catalyst on a substrate.

The substrate is not particularly limited, and can appropriately be selected from known substrates used as substrates in electron devices. Suitable examples include semiconductor substrates such as silicon substrates and the like. Apart from the semiconductor substrates, substrates such as a glass substrate and the like are also included as the suitable examples.

The islands formed of a catalyst can be formed on an insulating film, after accumulating (forming) the insulating film on the substrate.

Examples of the catalysts are materials of the aforementioned conductive particles.

The insulating film is not particularly limited, and can be appropriately selected in accordance with the object. Examples are silicon dioxide and the like, and the insulating film can be formed by a known oxidation method or the like. The islands formed of the catalyst can be formed by a lithographic technique. For example, after a resist pattern formed of a known resist material is formed on the insulating film, the islands formed of the catalyst can be formed on the insulating film by using the resist pattern as a mask pattern, and then the resist pattern can be removed by a processing such as lift-off, etching or the like. In this way, two or more islands formed of the catalyst are formed on the substrate. Note that the size of the islands formed of the catalyst is not particularly limited, and can be appropriately selected in accordance with the object.

The carbon-based linear structural body is formed so as to connect a first island and a second island among two or more islands formed of a catalyst on a substrate.

The carbon-based linear structural body is as described above, and can be formed between the first island and the second island by, for example, CVD by applying an electric field. The CVD method is not particularly limited, and may be plasma CVD, thermal CVD, or the like.

When the carbon-based linear structural body is formed by CVD, it is preferable that the first island has a sharp end portion at the second island side and the second island has a sharp end portion at the first island side. This is advantageous in that the electric field, which is applied as a catalyst between the first island and the second island, can be efficiently concentrated, and the efficiency of forming the carbon-based linear structural body is excellent.

In the electrode forming step, a first electrode is formed so as to contact the first island and one end of the carbon-based linear structural body, and a second electrode is formed so as to contact the second island and the other end of the carbon-based linear structural body. As a result, the first electrode and the second electrode are connected through the carbon-based linear structural body including at least one conductive particle or two lattice defects and the conductive particle or lattice defects are positioned between the first electrode and the second electrode.

The first electrode and the second electrode are as described above, and can be formed by a lithographic technique. For example, the first and second electrodes can be formed by, after forming a resist pattern of a resist material on the carbon-based linear structural body, the first island and the second island, depositing an electrode material while using the resist pattern as a mask pattern, and then removing the resist pattern by a processing such as lift-off, etching or the like. In this way, the first electrode is formed so as to contact the first island and one end of the carbon-based linear structural body, and the second electrode is formed on the second island so as to contact the second island and the other end of the carbon-based linear structural body.

The third electrode can be formed on the reverse surface of the substrate by deposition, or the like, the same material as that of the first electrode, for example a known metal material. The third electrode is electrically insulated from the first electrode and the second electrode, and can be made to function as a gate electrode.

Hereinafter, Examples of the present invention will be described. However, the present invention is not limited to these Examples.

Figure 1A:
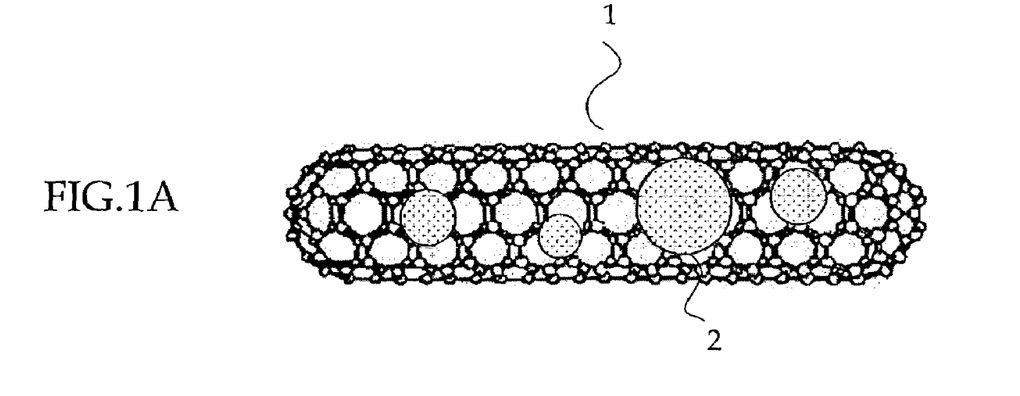
FIG. 1A is a schematic diagram showing an example of a carbon-based linear structural body containing at least one conductive particle.
Figure 1B:
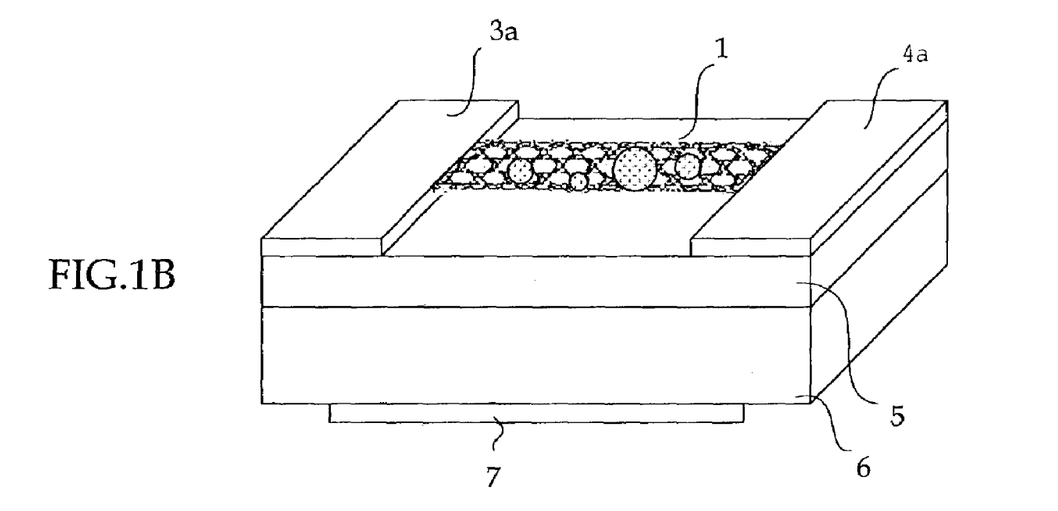
FIG. 1B is a schematic diagram showing an example of a single electron transistor using the carbon-based linear structural body.
Figure 7A:
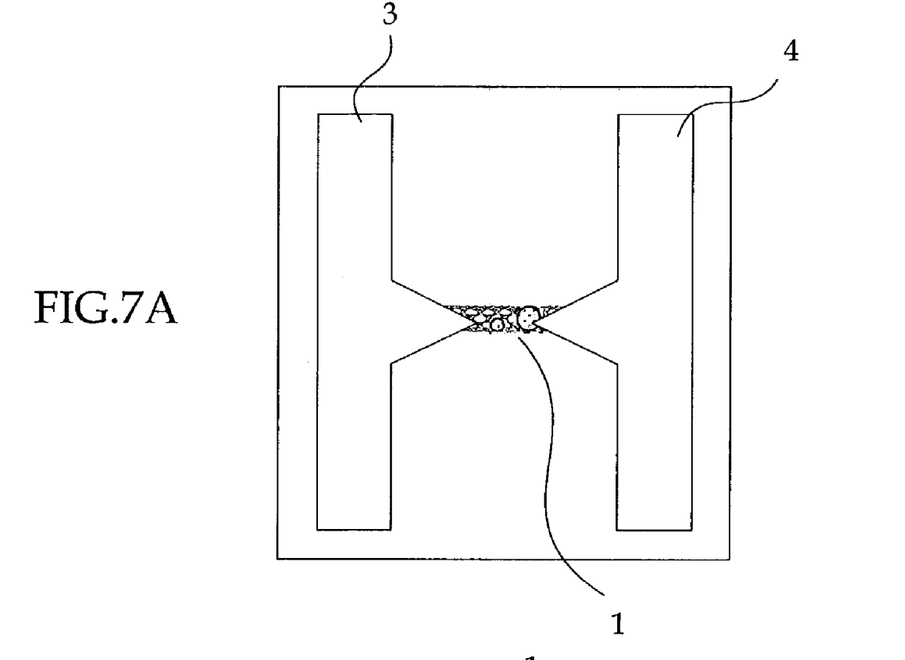
FIGS. 7A and 7B are schematic diagrams for explaining states in which a carbon nanotube(s) is/are formed in a state in which a first island has a sharp end portion(s) towards a second island, and a second island has a sharp end portion(s) towards a first island.
Figure 7B:
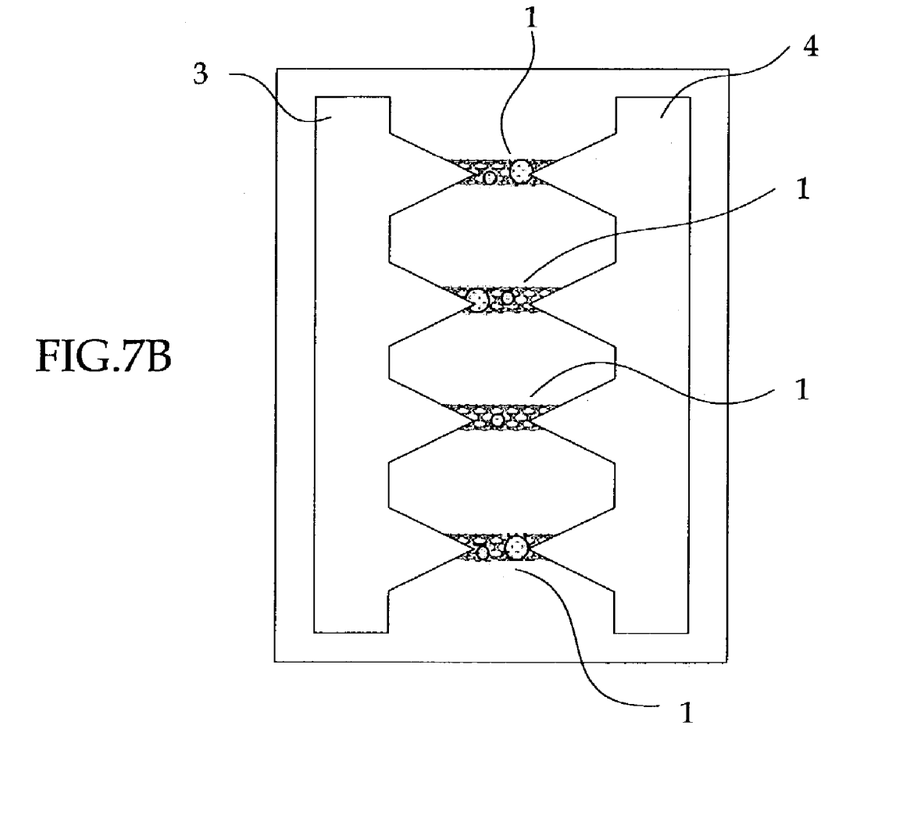

In a carbon nanotube grown by CVD by using iron as a catalyst, as shown in FIG. 1A, the iron which is the catalyst exists within the carbon nanotube at points in the form of atoms or as clusters of a small number of atoms. Here, the iron which is the catalyst functions as the islands "2". When the carbon nanotube "1" is long, a plurality of the island("2")s exist within the carbon nanotube "1". As a result, a so-called multi-junction type single electron semiconductor or single electron transistor, in which a plurality of tunnel junctions are connected in series, is formed. FIG. 1B shows an example of a semiconductor device (a single electron transistor) using the carbon nanotube "1" shown in FIG. 1A. In this semiconductor device (single electron transistor), the carbon nanotube "1" is formed between the catalyst (iron) patterns and on the insulating film (silicon dioxide) "5", which has been accumulated on the semiconductor substrate (silicon substrate) "6". Metal electrodes for decreasing contact resistance are added on the catalyst (iron) patterns. The metal electrodes function as the source electrode "3a" and the drain electrode "4a" of the single electron transistor. Further, a gate electrode "7" for current control is provided at the reverse surface of the semiconductor substrate "6". The catalyst (iron) patterns may preferably have sharp end portions at the side of the opposing metal electrode (i.e., the distal end of each catalyst (iron) pattern tapers towards the opposing metal electrode), such that the electric field applied between the catalyst (iron) patterns efficiently concentrates at the time of CVD growth in the carbon nanotube forming processing which will be described later. A single sharp end portion may be provided as shown in FIG. 7A, or a plurality of sharp end portions may be provided in a row as shown in FIG. 7B.

Figure 6A:
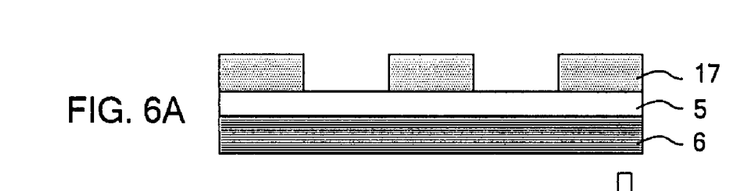
FIGS. 6A, 6B, 6C, 6D, 6E, 6F, 6G and 6H are process diagrams showing an example of fabricating the single electron transistor of the present invention.
Figure 6B:
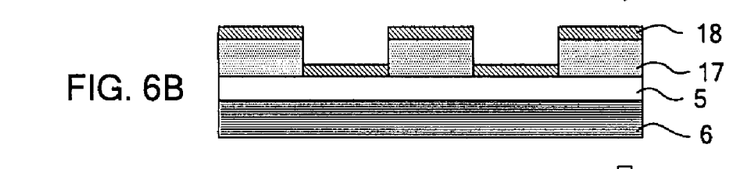
Figure 6C:
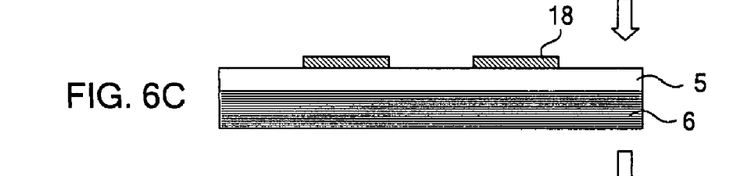
Figure 6D:
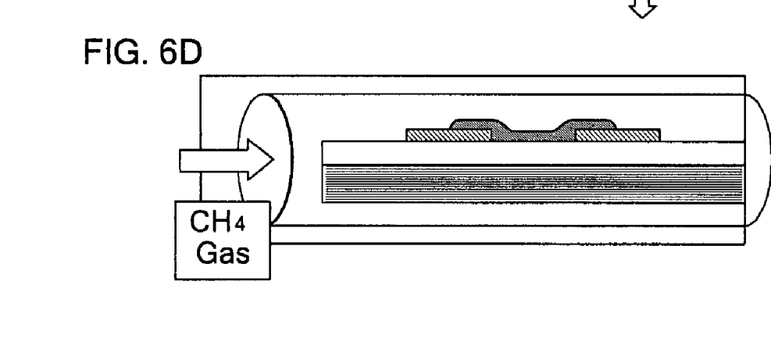

Conventionally, the position control of the carbon nanotube was extremely difficult. Conventionally, it was only possible to employ a method in which carbon nanotubes were mixed in a liquid and dispersed and coated, and thereafter, the carbon nanotubes were moved to predetermined positions by AFM cantilever or the like. In the present invention, as described above, the position control is carried out by using catalyst patterning. Namely, first, a silicon insulating film "5" of 100 nm is formed on a single conductive type (here, p-type) silicon substrate "6", and the resist material "17" is patterned by exposure light (as shown in FIG. 6A). Then, iron, which is the catalyst, "18" is deposited, and catalyst patterns are formed by lift-off (as shown in FIGS. 6B and 6C). This step may be replaced by the series of processes that depositing of the catalyst metal, resist patterning, and etching of the catalyst metal. Thereafter, carbon nanotubes are grown by plasma CVD or thermal CVD (as shown in FIG. 6D). A specific example of the conditions of the thermal CVD is conditions such as follows. Methane gas (or acetylene gas) is used as the raw material gas, the flow rate of the raw material gas is 1000 sccm, the temperature of the semiconductor substrate is about 900° C., and the time for growing the carbon nanotubes is 30 minutes. At the time of growing the carbon nanotube, by applying an electric field between the opposing patterns, the patterns can be connected over the shortest distance by a carbon nanotube.

Figure 2:
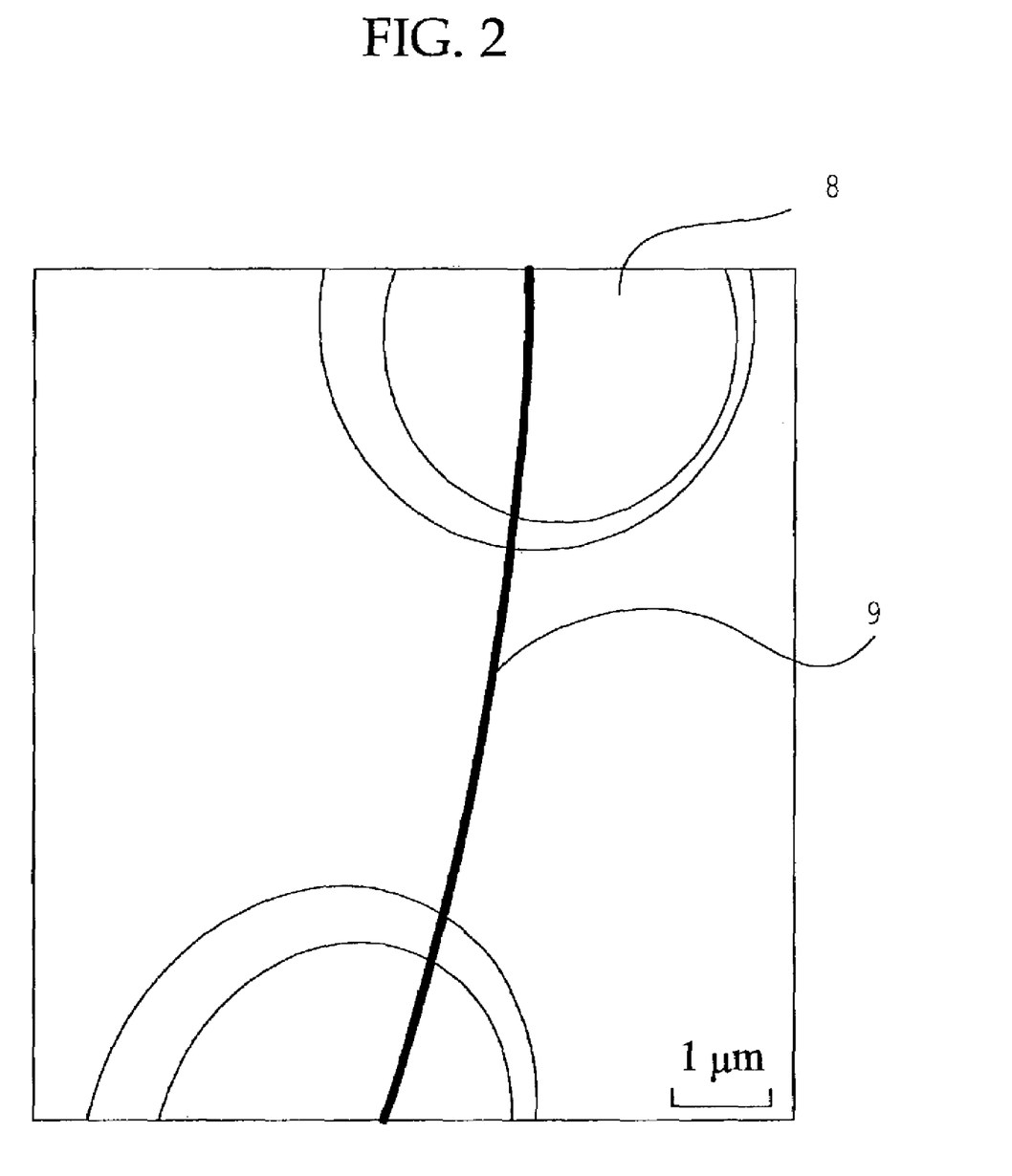
FIG. 2 is a schematic diagram modeling an example of an electron microscope photograph corresponding to a plan view of the single electron transistor shown in FIGS. 1A and 1B.

FIG. 2 shows the results of position control of growth of a carbon nanotube prepared by the above-described carbon nanotube forming process by using circular patterns of the iron catalyst. Here, it can be found that a single carbon nanotube "9" is grown between the circular patterns of the iron catalyst "8". Because iron is used as the catalyst, the carbon nanotube is a single wall structure (single layer structure). A carbon nanotube having a multi-wall structure (multilayer structure) can be formed using another metal as the catalyst. By the above-described carbon-based linear structural body forming step, a carbon-based linear structural body (a carbon nanotube) is formed so as to connect a first island and a second island among two or more islands formed of a catalyst (iron) on a semiconductor substrate (silicon substrate) (see FIGS. 6A, 6B, 6C and 6D).

Figure 6E:
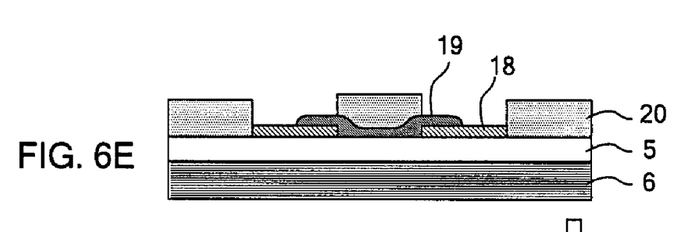
Figure 6F:
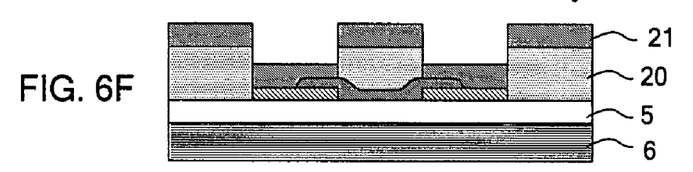
Figure 6G:
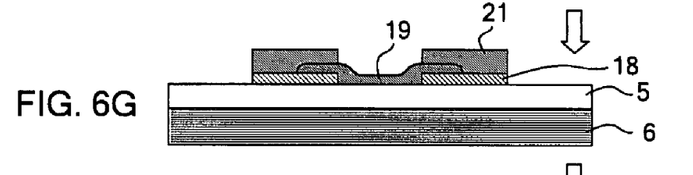
Figure 6H:
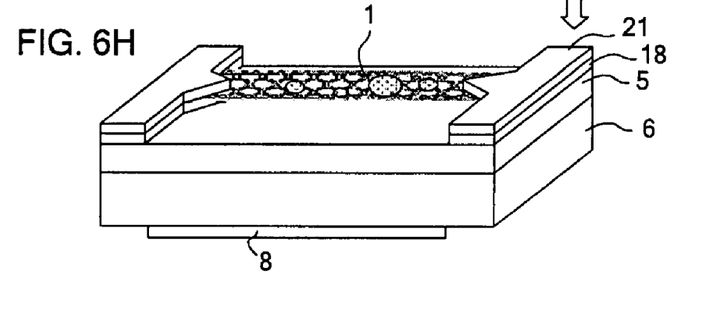

Next, by carrying out patterning of the resist "20", deposition of an electrode metal "21", lift-off, and the like, the source electrode and the drain electrode are formed on the catalyst patterns (as shown in FIGS. 6E, 6F and 6G). As needed, a heat treatment of approximately 600° C. to 800° C. can be carried out in an argon atmosphere in order to decrease the contact resistance of the source electrode and the drain electrode. Moreover, a gate electrode "8" is formed on the reverse surface of the semiconductor substrate by carrying out patterning, gate electrode deposition, lift-off, high-temperature annealing, and the like (as shown in FIG. 6H). The single electron transistor can thereby be manufactured. In the above-described electron forming step, the first electrode (the source electrode) "22" is formed so as to contact the first island (the circular pattern of the iron catalyst) "24" and the carbon-based linear structural body (the carbon nanotube) "19", and the second electrode (the drain electrode) "23" is formed so as to contact the second island (the circular pattern of the iron catalyst) "25" and the carbon-based linear structural body (the carbon nanotube) "19". The third electrode (the gate electrode) "8" is formed on the reverse surface of the semiconductor substrate (the silicon substrate). The single electron transistor "26" is thereby manufactured (see FIGS. 6A, 6B, 6C, 6D, 6E, 6F, 6G and 6H).

Figure 3:
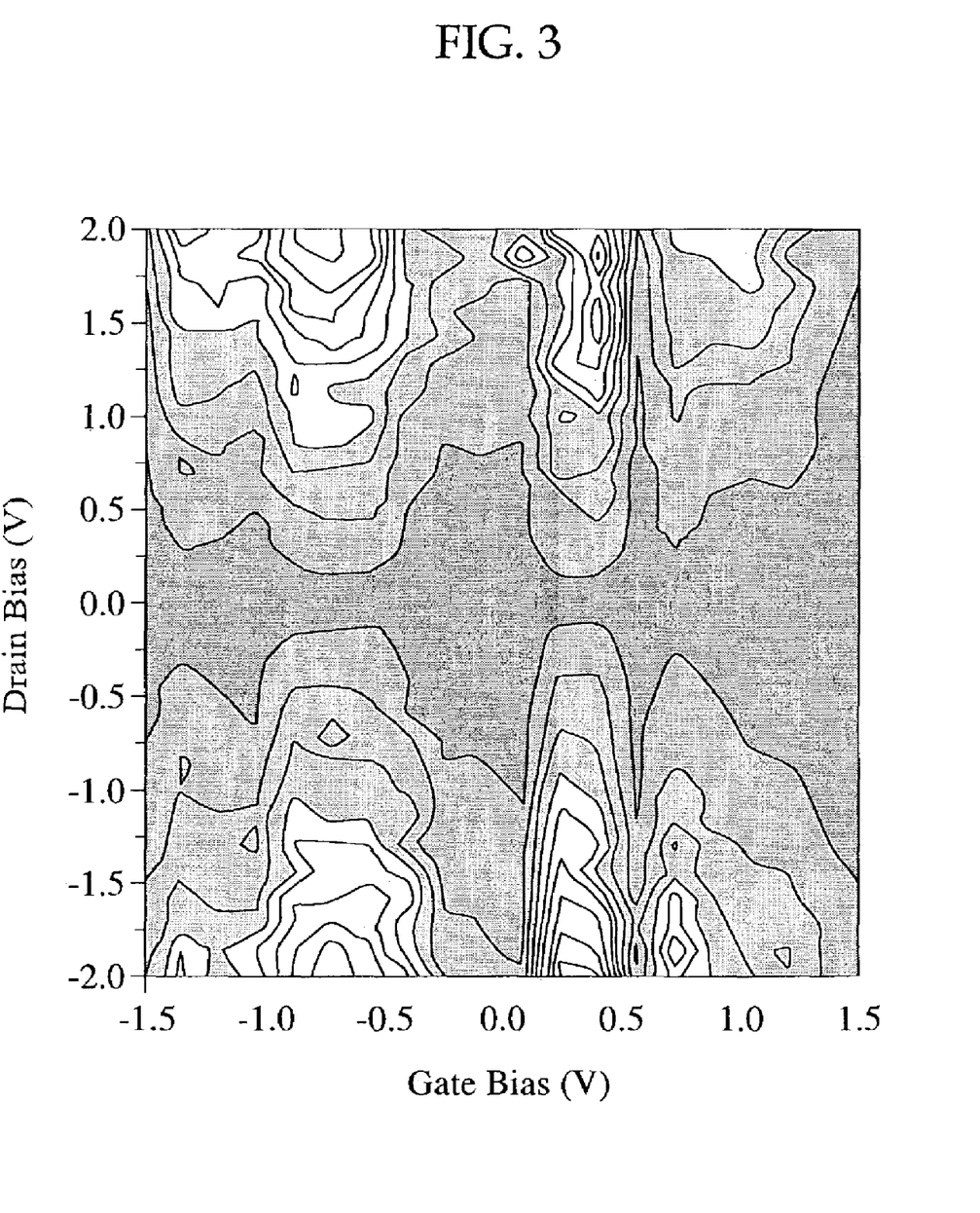
FIG. 3 is an example of a graph showing the relationship between the gate voltage and the drain voltage, for explaining that the single electron transistor of the present invention exhibits a Coulomb diamond characteristic at room temperature.

The gate voltage and drain voltage dependence of the drain current is shown in FIG. 3 as a characteristic of the single electron transistor which is manufactured as described above. The darker portions in FIG. 3 are Coulomb blockade regions where it is difficult for current to flow. It is clear that these regions are greatly modulated by the gate voltage. Accordingly, it can be understood that the single electron transistor exhibits a good Coulomb diamond (single electron) characteristic at room temperature.

Figure 4:
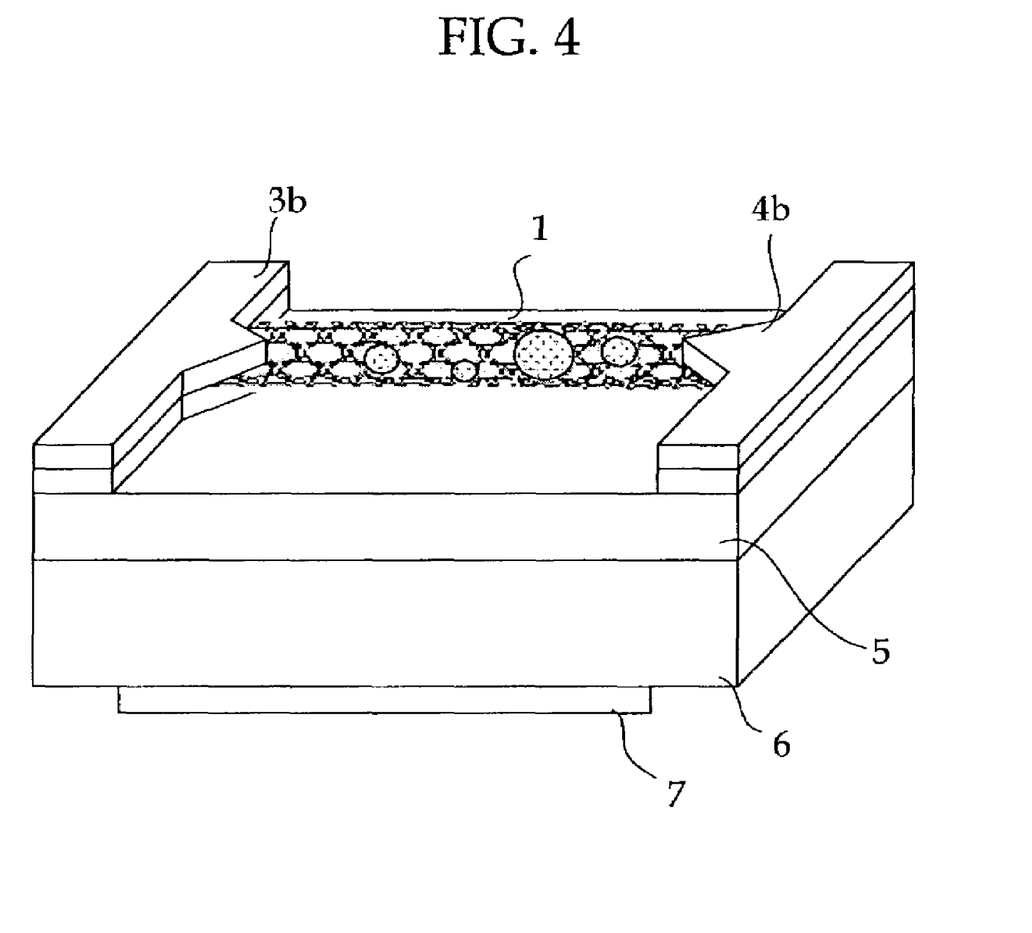
FIG. 4 is a schematic diagram showing an example of a single electron transistor of the present invention formed in a state in which a first island has a sharp end portion towards a second island, and a second island has a sharp end portion towards a first island.

FIG. 4 is a schematic diagram showing an example of a single electron transistor of the present invention formed in a state that the first island has a sharp end portion towards the second island, and the second island has a sharp end portion towards the first island. When a single electron transistor was manufactured in the same way as in the above-described Example except that the configurations of the first island (the catalyst pattern) and the second island (the catalyst pattern) were changed, a high-quality single electron transistor was obtained in the same way as in the above-described Example.

Figure 5A:
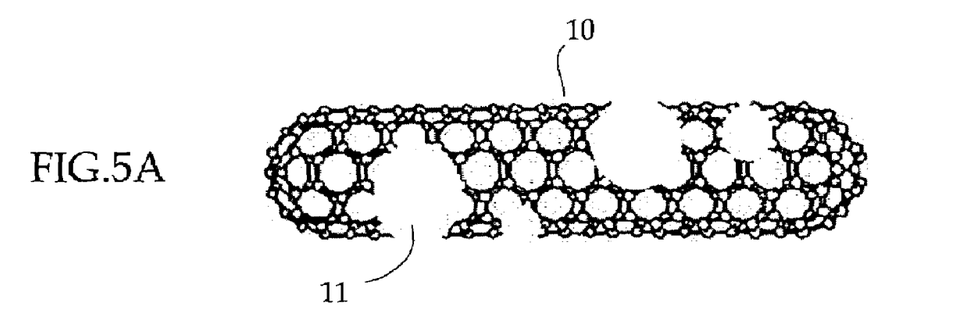
FIG. 5A is a schematic diagram showing a carbon-based linear structural body having at least two lattice defects.
Figure 5B:
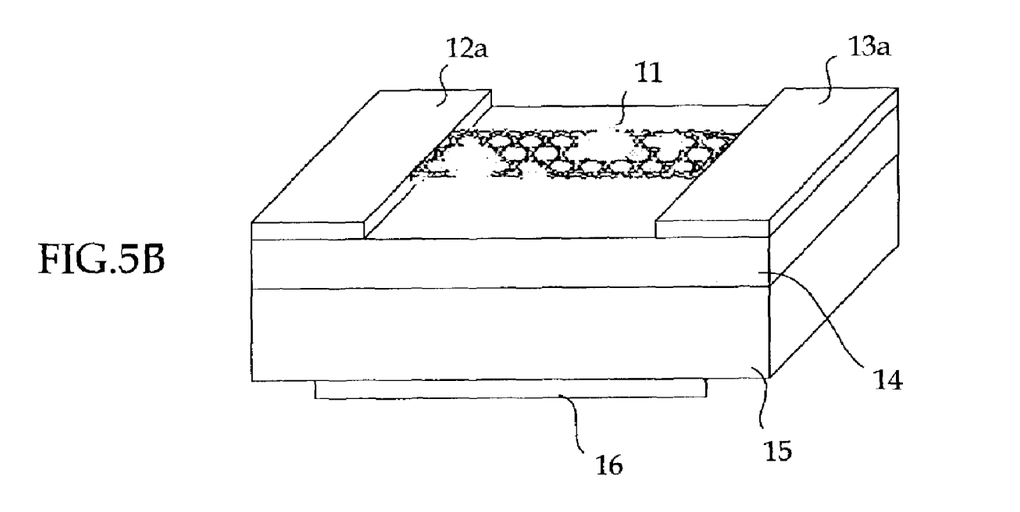
FIG. 5B is a schematic diagram showing an example of a single electron transistor using the carbon-based linear structural body.
Figure 5C:
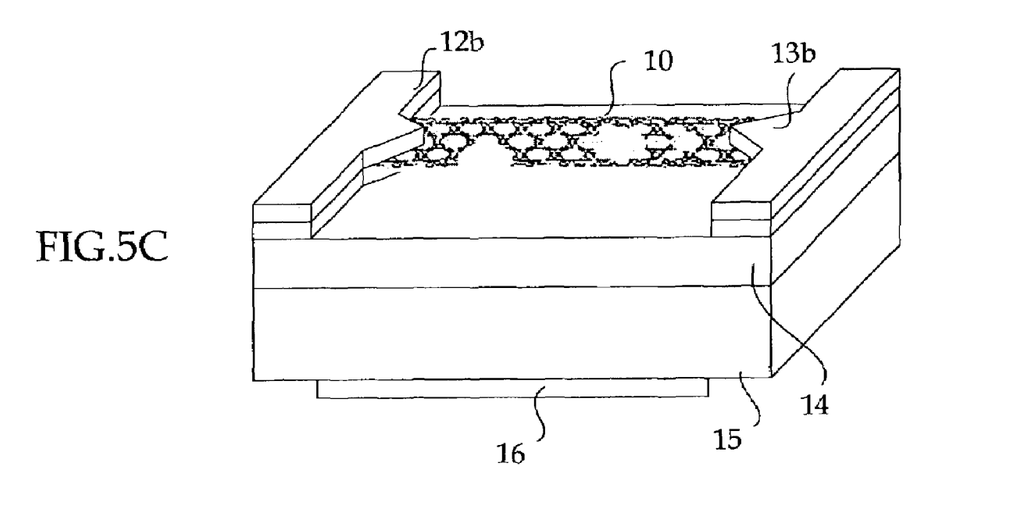
FIG. 5C is a schematic diagram showing an example of a single electron transistor of the present invention formed in a state in which a first island has a sharp end portion towards a second island, and a second island has a sharp end portion towards a first island.

FIG. 5A is a schematic diagram showing one example of a carbon-based linear structural body "10" having at least two lattice defect("11")s. FIG. 5B is a schematic diagram showing one example of a single electron transistor using this carbon-based linear structural body "10". When a single electron transistor was manufactured in the same way as in the above-described Example except that the conductive islands in the carbon-based linear structural body were not conductive particles and rather were regions of the carbon-based linear structural body surrounding lattice defects, a high-quality single electron transistor was obtained in the same way as in the above-described Example. FIG. 5C is a schematic diagram showing an example of the single electron transistor of the present invention formed in a state in which the first island has a sharp end portion towards the second island, and the second island has a sharp end portion towards the first island. When a single electron transistor was manufactured in the same way as the above-described Example except that the configurations of the first island (the catalyst pattern) and the second island (the catalyst pattern) were changed, a high-quality single electron transistor was obtained in the same way as in the above-described Example.

In accordance with the present invention, there is provided an electron device which can overcome the drawbacks of the conventional art, and which has a fine structure, and which operates extremely stably at room temperature, and which can be mass produced inexpensively by using photolithography, CVD, or the like, and which is particularly suitable for a single electron transistor. The present invention also provides an efficient process of manufacturing this electron device.

What is claimed is:

1. An electron device comprising:
   a carbon-based linear structural body constructed of a carbon lattice and including at least two lattice defects;
   a first electrode disposed at one end of the carbon-based linear structural body; and
   a second electrode disposed at the other end of the carbon-based linear structural body, and
   wherein the carbon-based linear structural body including at least two lattice defects is formed with chemical vapor deposition (CVD) over the first electrode and the second electrode; and
   each of the lattice defects is an atomic vacancy of a carbon atom in the carbon lattice constructing the carbon-based linear structural body,
   wherein the first electrode comprises a first protruding portion comprising a first sharp end portion, and the second electrode comprises a second protruding portion comprising a second sharp end portion, wherein the first protruding portion of the first electrode faces the second protruding portion of the second electrode, and
   wherein the first sharp end portion of the first electrode faces the second sharp end portion of the second electrode, and the carbon-based linear structural body extends from each sharp end portion.

2. An electron device according to claim 1, further comprising a third electrode imparting an electric field effect to the carbon-based linear structural body.

3. An electron device according to claim 2, wherein the first electrode and the second electrode are a source electrode and a drain electrode, and the third electrode is a gate electrode.

4. An electron device according to claim 1, wherein the carbon-based linear structural body is a linear structural body having any of six-membered carbon rings and five-membered carbon rings, each of which is bonded to each other.

5. An electron device according to claim 4, wherein the carbon-based linear structural body is a carbon nanotube.

6. An electron device according to claim 1, wherein the carbon-based linear structural body including at least two lattice defects is formed with CVD by applying an electric field between the first electrode and the second electrode so as to cause the carbon-based linear structural body including at least two lattice defects to connect between the first electrode and the second electrode.

7. An electron device according to claim 1, wherein the first electrode and the second electrode comprise a plurality of sharp end portions, respectively.

* * * * *